United States Patent
Allen et al.

[19]

[11] Patent Number: 6,153,934

[45] Date of Patent: Nov. 28, 2000

[54] BURIED BUTTED CONTACT AND METHOD FOR FABRICATING

[75] Inventors: Archibald Allen, Shelburne; Jerome B. Lasky, Essex Junction; Randy W. Mann, Jericho; Jed H. Rankin, Burlington; Francis R. White, Essex Junction, all of Vt.

[73] Assignee: International Business Machines Corporation, Armonk, N.Y.

[21] Appl. No.: 09/126,577

[22] Filed: Jul. 30, 1998

[51] Int. Cl.[7] .................................................. H01L 23/48
[52] U.S. Cl. ............................................ 257/773; 257/372
[58] Field of Search .................................... 257/773, 372; 438/620, 621

[56] References Cited

U.S. PATENT DOCUMENTS

| | | | |
|---|---|---|---|
| 3,768,150 | 10/1973 | Sloan, Jr. et al. | 29/578 |
| 4,392,150 | 7/1983 | Courreges | 357/51 |
| 4,717,682 | 1/1988 | Taka et al. | 437/31 |
| 4,835,111 | 5/1989 | Wright et al. | 437/20 |
| 4,914,050 | 4/1990 | Shibata | 437/38 |
| 4,933,739 | 6/1990 | Harari | 357/55 |
| 5,315,150 | 5/1994 | Furuhata | 257/588 |
| 5,521,113 | 5/1996 | Hsue et al. | 437/52 |
| 5,550,085 | 8/1996 | Liu | 437/203 |
| 5,580,806 | 12/1996 | Chang et al. | 437/44 |
| 5,589,418 | 12/1996 | Kalnitsky | 437/193 |
| 5,607,881 | 3/1997 | Huang | 437/195 |
| 5,654,231 | 8/1997 | Liang et al. | 438/197 |
| 5,880,527 | 3/1999 | Shin | 257/773 |

*Primary Examiner*—David Hardy
*Assistant Examiner*—Lourdes Cruz
*Attorney, Agent, or Firm*—Pollock, Vande Sande & Amernick; William D. Sabo

[57] ABSTRACT

A buried butted contact and method for its fabrication are provided which includes a substrate having dopants of a first conductivity type and having shallow trench isolation. Dopants of a second conductivity type are located in the bottom of an opening in said substrate. Ohmic contact is provided between the dopants in the substrate and the low diffusivity dopants that is located on a side wall of the opening. The contact is a metal silicide, metal and/or metal alloy.

10 Claims, 1 Drawing Sheet

BURIED BUTTED CONTACT AND METHOD FOR FABRICATING

TECHNICAL FIELD

The present invention is concerned with a buried butted contact. More particularly, the present invention is concerned with providing an ohmic contact through shallow trench isolation of an n-type diffusion to ground or a p-type diffusion to Vdd. The buried contact of the present invention is vertically displaced from the top surface of the substrate and permits the contact to be formed in reduced area. The buried contact of the present invention does not extend to any significant extent under the active surface diffusion. According to the present invention, a buried diffusion is contacted below the surface of the substrate to surface diffusion of an opposite polarity type by a metallic-type interconnection line. The metallic-type interconnection line can be a metal, a metal alloy, and/or an intermetallic silicide. The present invention is also concerned with a method for fabricating the buried butted contact.

BACKGROUND OF INVENTION

Butted contacts have been used for contacting n-type diffusion to ground or a p-type diffusion to Vdd power supply. Butted contacts provide a relatively dense contacting method. A method typically employed for creating butted contacts involves placing opposite diffusion blocks within the same active area, whereby the diffusion blocks do not overlap. However, this technique requires sufficient real estate in order to guarantee that both diffusion types are reliably created, thereby taking up increased area.

Furthermore, the substrate well contact diffusion, when butted against a FET diffusion, tends to create some degradation in transistor performance as the well contact diffusion gets closer and approaches the FET gate edge. It is believed that dopant diffusion of opposite species type from the substrate or well contact causes this degradation.

Accordingly, it would be desirable to provide a butted contact that requires less real estate along with eliminating or at least significantly reducing contamination of the device by dopant diffusion from the butted contact.

SUMMARY OF INVENTION

The present invention provides butted contacts that require reduced area along with eliminating contamination of the device from the dopants of the contact. The present invention provides for contacting an n-type diffusion to ground or a p-type diffusion to Vdd power supply. According to the present invention, the contact is vertically displaced from the top surface of the substrate.

More particularly, the present invention is concerned with a buried butted contact that comprises a substrate having dopants of a first conductivity type and having shallow trench isolation. Dopants of a second and opposite conductivity type are located in the bottom of an opening through the substrate and down to the bottom of the shallow trench isolation. Ohmic contact between the dopants of the first conductivity type and the dopants of the second and opposite conductivity type is provided on a side wall of the opening. The ohmic contact is a metallic type interconnect being a metal, metal alloy and/or intermetallic silicide. The opening overlaps the edge portion of the shallow trench isolation and overlaps a small portion of the dopants of the first conductivity type.

The present invention is also concerned with a method for forming the above-described buried contact. The method of the present invention comprises providing a substrate having dopants of a first conductivity type and having shallow trench isolation. An opening is delineated in the substrate down to the vicinity of the bottom of the shallow trench isolation and overlaps a small portion of the edge of the shallow trench isolation and a small portion of an edge of the dopants of the first conductivity type. Dopants of a second and opposite conductivity type are implanted into the bottom of the opening to thereby form a buried contact. A layer of a metallic type electrically conductive material is deposited on a side wall of the opening to provide ohmic contact between the dopants of the first conductivity type in the substrate and dopants of the second and opposite conductivity type. The metallic-type electrically conductive material is a metal, metal alloy and/or intermetallic silicide.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures which illustrate a diagrammatic representation of the steps of fabricating the buried butted contact according to the present invention.

It is to be understood that when the discussion refers to n-type impurities, the particular process steps are applicable to p-type impurities, and vice versa. Also, the present invention is applicable to substrates other than silicon which are known in the art such as other semiconductor materials including group III-V semiconductors. Furthermore, when reference is made to impurities of a "first type" and to impurities of a "second type", it is understood that the "first type" refers to n- or p-type impurities and "second type" refers to the opposite conductivity type. That is, if the "first type" is p, then the "second type" is n. If the "first type" is n, then the "second type" is p. P-type dopants for silicon include boron, aluminum, gallium, and indium. N-type dopants for silicon include arsenic, phosphorus and antimony.

Figure 1:
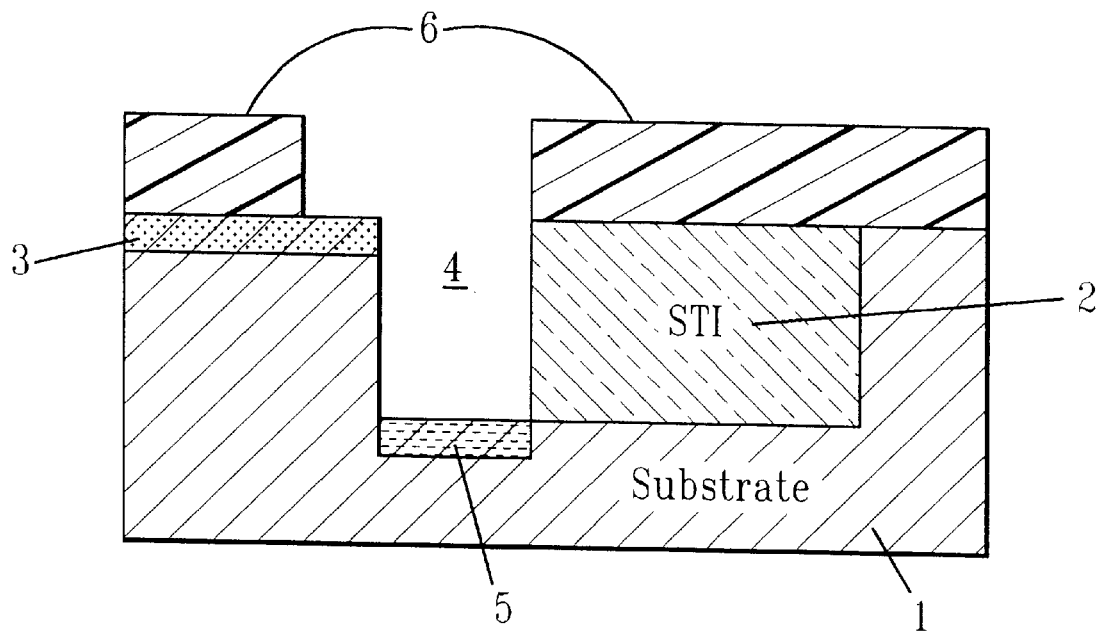
FIGS. 1–2 are schematic illustrations of the structure at different stages of fabrication according to the present invention.

According to the present invention, shallow trench isolation 2 is provided in a semiconductor substrate 1 (see FIG. 1). The semiconductor substrate is typically silicon but can be any other semiconductor material such as group III-V semiconductor. The isolation can be silicon dioxide. Also, in the vicinity of the top portion of substrate 1 is dopant 3 of a first conductivity type. The dopant for an n-type dopant in the case of silicon can be arsenic, phosphorus and antimony and the in the case of a p-type dopant can be boron, aluminum, gallium and indium. The dopant can be provided by any conventional technique such as diffusion or ion implantation. Typically, the dopant concentration of the first conductivity type is at least about $5\times10^{19}$ atoms/cm$^3$.

An opening 4 is provided in the substrate by typical patterning techniques such as by applying a photosensitive resist material, exposing it imagewise to actinic light such as UV radiation, X-ray radiation or E-beam radiation in a predetermined pattern to define the opening. In the case of a positive resist, the portion exposed to the actinic light is removed by dissolving in a suitable solvent. In the case of a negative photoresist, the portion not exposed to the actinic light is removed by dissolution in a suitable solvent. The patterned photoresist then acts as a mask for removing exposed portions of the substrate down to within the vicinity of the bottom of the shallow trench isolation. The opening is patterned such that the opening overlaps a small portion of the shallow trench isolation at the trench edge and a small portion, typically about 0.01 $\mu m^2$ to about 1 $\mu m^2$ of the diffusion 3 of the first conductivity type. In other words, only a small portion of the opening overlaps the edge of the shallow trench isolation extend past the edge of the conductivity of the first conductive type but does extend to the edge of such. In the case of a PFET butted contact, the conductivity of the first type will be an n-well and for a NFET butted contact, the conductivity of the first type will be a p-well.

The portions of substrate 1 not protected by the photoresist mask can be removed such as by employing reactive ion etching.

In a typical example according to the present invention, a dopant 5 of the second and opposite conductivity type is then implanted into the bottom of the opening 4. In the case of the dopant of the first type being n+, the preferred dopant of the second type (p-type) is indium. In the case of the dopant of the first type being p-type, the preferred dopant of the second type (n-type) is antimony. According to preferred aspects of the present invention, the dopant 5 of the second and opposite conductivity type exhibit relatively low diffusivity characteristics. The dosage of the dopant of the second and opposite conductivity type should be sufficient to provide an adequate ohmic contact and is typically at least about $1\times10^{14}$ atoms/cm² and more typically the dosage is no greater than about $1\times10^{16}$ atoms/cm².

A second photoresist 6 is applied and then patterned to expose only the areas to provide the butted contact. The pattern exposes a portion of the shallow trench isolation at the boundary with the silicon substrate. The exposed portion of oxide isolation is removed by etching down to the bottom of the substrate. Typically, the small portion is only about 0.01 $\mu m^2$ to about 1 $\mu m^2$, and more typically about 0.03 $\mu m^2$ to about 0.09 $\mu m^2$.

Figure 2:
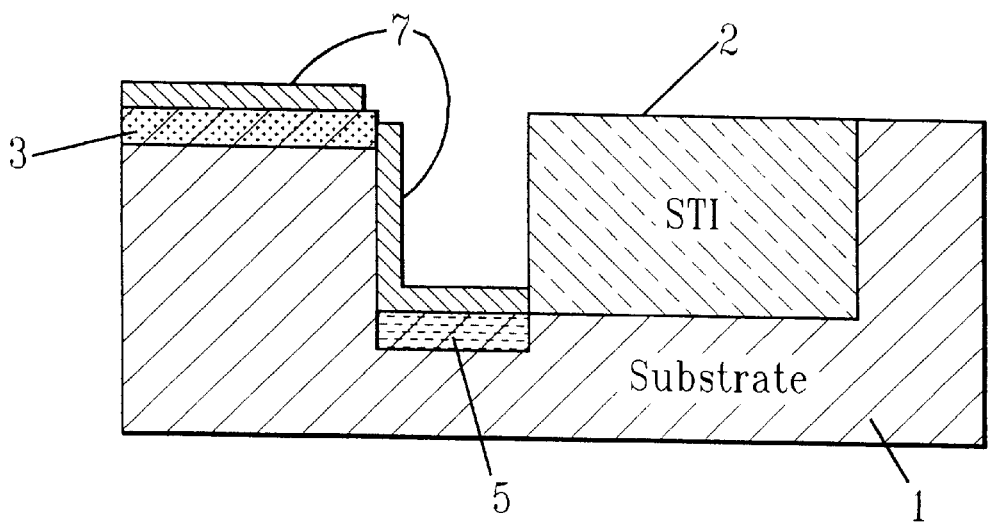

Next, the metallic type interconnection 7 (see FIG. 2) between the dopants of the first conductivity type and dopant of the second conductivity type is formed. In particular, examples of some suitable metal silicide layers include titanium silicide, molybdenum silicide, zirconium silicide, hafnium silicide, vanadium silicide, niobium silicide, tantalum silicide, chromium silicide, and tungsten silicide. Such can be formed by sputtering such as from a solid silicide target. In addition, the metallic-type interconnect can be provided by depositing a layer of a refractory metal or refractory metal alloy such as tungsten, titanium, zirconium, hafnium, vanadium, niobium, tantalum, chromium, and molybdenum. The preferred metal is tungsten. Such can be deposited by sputtering or chemical vapor deposition. The methods for depositing the interconnect layers are well known in the art and need not be described herein in any great detail. For instance, see U.S. Pat. Nos. 3,768,150 and 4,392,150, disclosures of which are incorporated herein by reference.

The metallic-type interconnect layer 7 is provided on side wall of the opening and contacts the diffusion of the second type and extends to the diffusion of the first type. It is not necessary that the metallic type interconnect extend continuous over the entire area of the dopant of the second conductivity type. The silicide interconnect layer is about 200 to about 1000 Å thick and preferably about 300 to about 500 Å thick.

The structure subjected to further processing to complete the device as readily apparent to those skilled in the art.

As can be appreciated from the above description, the contact created according to the present invention is vertically displaced from the surface, thereby allowing it to be formed in much smaller area. In particular, a mask to block implants of one conductivity type need not be defined adjacent to a mask for blocking impurities of the second conductivity type so as to guarantee formation of the opposite polarity junction. Furthermore, the present invention provides a buried contact implant that is self-aligned to the opposite polarity doped substrate and that no dopant contamination of the device occurs from the butted buried contact.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A buried butted contact comprising a substrate having dopants of a first conductivity type, shallow trench isolation, and an opening having a bottom;

dopants of a second and different conductivity type located in the bottom of opening in said substrate;

ohmic contact between said dopants of a first conductivity type and said dopants of a second and different conductivity type located on a side wall of said opening and being selected from the group consisting of metal silicide, a metal, metal alloy, and mixtures thereof.

2. The buried butted contact of claim 1 wherein said ohmic contact comprises a metal.

3. The buried butted contact of claim 2 wherein said metal is a refractory metal.

4. The buried butted contact of claim 2 wherein said metal is tungsten.

5. The buried butted contact of claim 1 wherein said ohmic contact comprises a metal alloy.

6. The buried butted contact of claim 1 wherein said ohmic contact comprises a metal silicide.

7. The buried butted contact of claim 1 wherein the the dopants of a first conductivity type have a concentration of at least about $5\times10^{19}$ atoms/cm³.

8. The buried butted contact of claim 1 wherein the dopants of a second and opposite conductivity type have a dosage of at least about $1\times10^{14}$ atoms/cm².

9. The buried butted contact of claim 1 wherein said substrate is silicon.

10. The buried butted contact of claim 9 which comprises iridium as one of the dopants and antimony as the dopant of a second and different conductivity type.

* * * * *